United States Patent
Zhang et al.

(10) Patent No.: US 11,843,031 B2
(45) Date of Patent: Dec. 12, 2023

(54) SHORT GATE ON ACTIVE AND LONGER GATE ON STI FOR NANOSHEETS

(71) Applicant: INTERNATIONAL BUSINESS MACHINES CORPORATION, Armonk, NY (US)

(72) Inventors: Chen Zhang, Guilderland, NY (US); Kangguo Cheng, Schenectady, NY (US); Wenyu Xu, Albany, NY (US); Ruilong Xie, Niskayuna, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 266 days.

(21) Appl. No.: 17/524,851

(22) Filed: Nov. 12, 2021

(65) Prior Publication Data

US 2023/0154982 A1    May 18, 2023

(51) Int. Cl.
*H01L 29/06* (2006.01)
*H01L 29/66* (2006.01)

(52) U.S. Cl.
CPC ...... *H01L 29/0665* (2013.01); *H01L 29/0653* (2013.01); *H01L 29/6656* (2013.01); *H01L 29/66553* (2013.01); *H01L 29/66742* (2013.01)

(58) Field of Classification Search
CPC ......... H01L 21/02603; H01L 21/28141; H01L 21/823431; H01L 21/823821; H01L 21/845; H01L 27/0886; H01L 27/0924; H01L 27/1211; H01L 29/0653; H01L 29/0665; H01L 29/0669; H01L 29/0673;
(Continued)

(56) References Cited

U.S. PATENT DOCUMENTS 6,348,385 B1  2/2002  Cha et al.
8,183,644 B1  5/2012  Chuang et al.
(Continued)

FOREIGN PATENT DOCUMENTS

WO    2011063163 A2    5/2011

OTHER PUBLICATIONS

Xu et al., "Improved Short Channel Effect Control in Bulk FinFETs With Vertical Implantation to Form Self-Aligned Halo and Punch-Through Stop Pocket", in IEEE Electron Device Letters, Jul. 2015, pp. 1-4.

(Continued)

*Primary Examiner* — David C Spalla
(74) *Attorney, Agent, or Firm* — Tutunjian & Bitetto, P.C.; L. Jeffrey Kelly

(57) ABSTRACT

A method is presented for forming a nanosheet device. The method includes forming nanosheets stacks over a substrate, the nanosheet stacks separated by shallow trench isolation (STI) regions, forming a first hardmask material over the nanosheet stacks, depositing a sacrificial gate, recessing the sacrificial gate such that recesses are defined adjacent the first hardmask material, wherein a top surface of the sacrificial gate is below a top surface of the first hardmask material, forming a second hardmask material in the recesses, defining a uniform gate length in both the first and second hardmask materials, and selectively trimming the first hardmask material such that a gate length over the nanosheet stacks is less than a gate length over the STI regions.

20 Claims, 14 Drawing Sheets

(58) Field of Classification Search
CPC ......... H01L 29/41791; H01L 29/66439; H01L 29/6653; H01L 29/66553; H01L 29/6656; H01L 29/66742; H01L 29/66795; H01L 29/775; H01L 29/785; H01L 29/7851; H01L 29/7853; H01L 29/7855; H01L 2029/7858

See application file for complete search history.

(56) References Cited

U.S. PATENT DOCUMENTS

| | | | |
|---|---|---|---|
| 10,217,672 B2 | 2/2019 | Xie et al. | |
| 10,297,664 B2 | 5/2019 | Xie | |
| 10,410,927 B1 | 9/2019 | Cheng et al. | |
| 2016/0149008 A1* | 5/2016 | Kim | H10B 12/0335 |
| | | | 257/295 |
| 2019/0096996 A1* | 3/2019 | Song | B82Y 10/00 |
| 2019/0355851 A1 | 11/2019 | Seshadri et al. | |
| 2020/0052132 A1 | 2/2020 | Ching et al. | |
| 2020/0144384 A1* | 5/2020 | Sagong | H10B 10/12 |
| 2021/0098450 A1 | 4/2021 | Huang et al. | |
| 2021/0305408 A1 | 9/2021 | Yu et al. | |
| 2021/0366908 A1* | 11/2021 | Pan | H01L 29/42376 |

OTHER PUBLICATIONS

International Search Report from PCT/EP2022/079724 dated Jan. 24, 2023. (14 pages).

\* cited by examiner

US 11,843,031 B2

SHORT GATE ON ACTIVE AND LONGER GATE ON STI FOR NANOSHEETS

BACKGROUND

The present invention relates generally to semiconductor devices, and more specifically, to a self-aligned method and structure of forming a short gate on the active region and a longer gate on shallow trench isolation (STI) region for nanosheet (NS) multi-threshold integration.

As semiconductor integrated circuits (ICs) or chips become smaller, stacked nanosheets, which are two-dimensional nanostructures with a thickness range on the order of 1 to 100 nanometers, are increasingly used. Nanosheets and nanowires are seen as a feasible device option for 5 nanometer and beyond scaling of semiconductor devices. The general process flow for nanosheet formation involves removing sacrificial layers of silicon germanium (SiGe) between the silicon (Si) sheets.

SUMMARY

In accordance with an embodiment, a method is provided for forming a nanosheet device. The method includes forming nanosheets stacks over a substrate, the nanosheet stacks separated by shallow trench isolation (STI) regions, forming a first hardmask material over the nanosheet stacks, depositing a sacrificial gate, recessing the sacrificial gate such that recesses are defined adjacent the first hardmask material, wherein a top surface of the sacrificial gate is below a top surface of the first hardmask material, forming a second hardmask material in the recesses, defining a uniform gate length in both the first and second hardmask materials, and selectively trimming the first hardmask material such that a gate length over the nanosheet stacks is less than a gate length over the STI regions.

In accordance with another embodiment, a method is provided for forming a nanosheet device. The method includes forming nanosheets stacks over a substrate, the nanosheet stacks separated by shallow trench isolation (STI) regions, forming a first hardmask material over the nanosheet stacks, depositing a first sacrificial material, removing the first hardmask material such that first recesses are defined over the nanosheet stacks, depositing a second sacrificial material in the first recesses defined over the nanosheet stacks, forming a second hardmask material over the second sacrificial material, recessing the first sacrificial material such that second recesses are defined adjacent the second hardmask material, forming a third hardmask material within the second recesses, defining a uniform gate length in both the second and third hardmask materials, and selectively trimming the second hardmask material such that a gate length over the nanosheet stacks is less than a gate length over the STI regions.

In accordance with yet another embodiment, a nanosheet device is provided. The nanosheet device includes nanosheets stacks disposed over a substrate, the nanosheet stacks separated by shallow trench isolation (STI) regions to define a non-uniform gate length across the nanosheet transistor such that a gate length over the nanosheet stacks is less than a gate length over the STI regions and a work function metal (WFM) disposed over the nanosheet stacks and the STI regions, wherein the WFM pinches off in a region defined by the gate length over the nanosheet stacks and the WFM is prevented from pinching off in a region defined by the gate length over the STI regions.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE DRAWINGS

The invention will provide details in the following description of preferred embodiments with reference to the following figures wherein.

Throughout the drawings, same or similar reference numerals represent the same or similar elements.

DETAILED DESCRIPTION

Embodiments in accordance with the present invention provide methods and devices for forming a short gate on the active region and a longer gate on the shallow trench isolation (STI) region for nanosheet (NS) multi-threshold integration. The exemplary embodiments of the present invention pertain to non-uniform gate length for a single horizontal transistor. As a result, the exemplary embodiments of the present invention present a method and structure of forming non-uniform gate length in which gate length (Lg) variation is self-aligned to the active region, which provides wider room in the gate-over-STI region for work function metal (WFM) patterning.

Examples of semiconductor materials that can be used in forming such nanosheet structures include silicon (Si), germanium (Ge), silicon germanium alloys (SiGe), silicon carbide (SiC), silicon germanium carbide (SiGeC), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Figure 1:
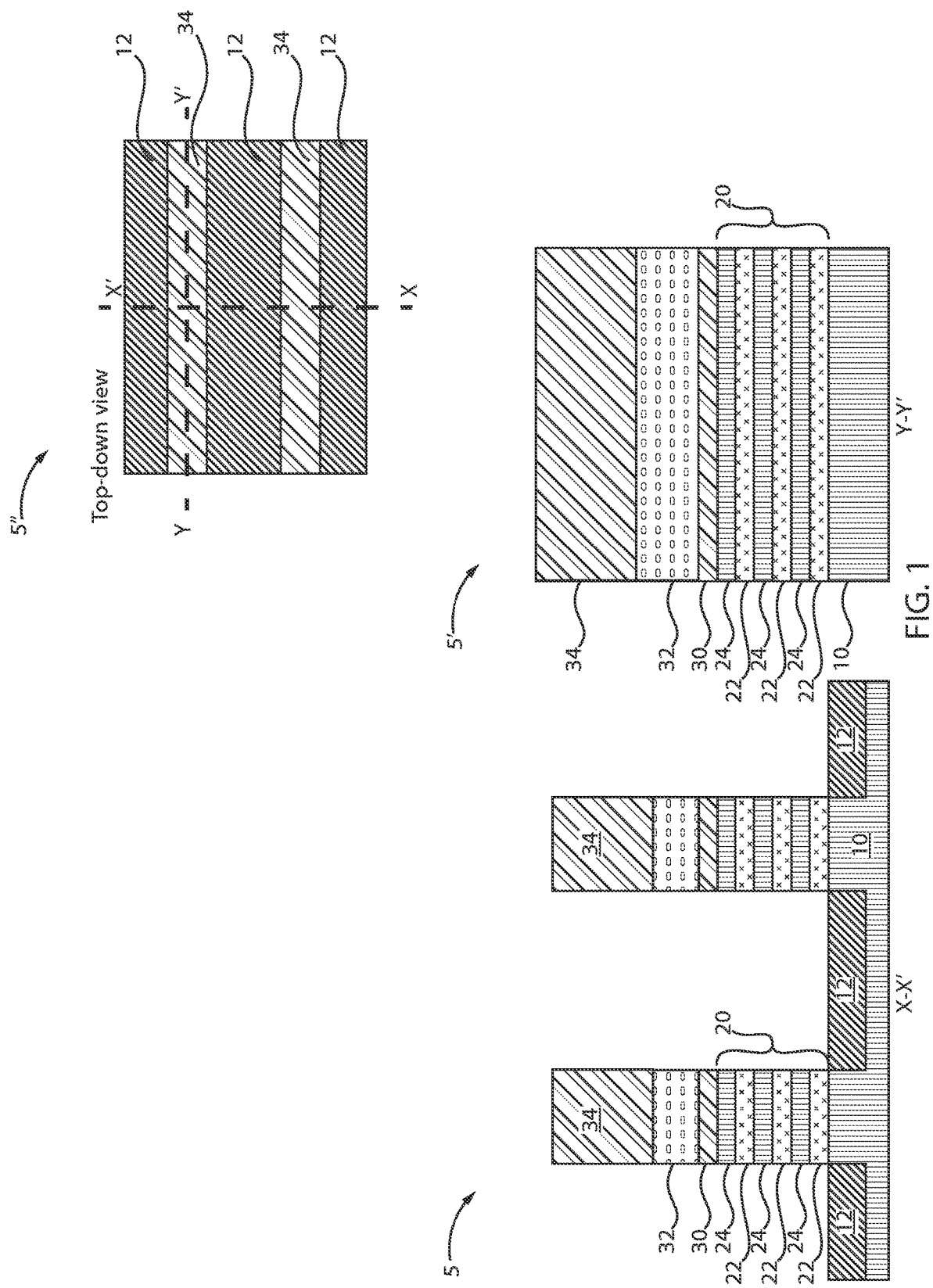
FIG. 1 is a cross-sectional view of a semiconductor structure including a nanosheet stack formed over a substrate, in accordance with an embodiment of the present invention.

FIG. 1 is a cross-sectional view of a semiconductor structure including a nanosheet stack formed over a substrate, in accordance with an embodiment of the present invention.

In various example embodiments, a semiconductor structure 5 includes shallow trench isolation (STI) regions 12 formed within a substrate 10. In one example, multiple field effect transistor (FET) devices can be formed over the substrate 10. The FET devices can be formed by constructing nanosheet stacks.

The nanosheet stacks 20 of structure 5 can include alternating layers of a first semiconductor layer 22 and a second semiconductor layer 24. The first semiconductor layer 22 can be, e.g., silicon germanium (SiGe) and the second semiconductor layer 24 can be, e.g., silicon (Si).

An oxide 30 can be formed over the nanosheet stacks 20. A sacrificial layer 32 can be formed over the oxide 30. A first hardmask 34 can be formed over the sacrificial layer 32.

The sacrificial layer 32 can be, e.g., an amorphous silicon (a-Si) layer.

The first hardmask 34 can be, e.g., a hardmask including nitride.

Structure 5' is a cross-sectional view along line Y-Y'. Structure 5' illustrates the nanosheet stacks 20 formed over the substrate 10, as well as the oxide 30, the sacrificial layer 32, and the first hardmask 34.

Structure 5" is a top view of structure 5. Structure 5" illustrates the STI regions 12, as well as the first hardmask 34.

In one or more embodiments, the substrate 10 can be a semiconductor or an insulator with an active surface semiconductor layer. The substrate 10 can be crystalline, semi-crystalline, microcrystalline, or amorphous. The substrate 10 can be essentially (e.g., except for contaminants) a single element (e.g., silicon), primarily (e.g., with doping) of a single element, for example, silicon (Si) or germanium (Ge), or the substrate 10 can include a compound, for example, $Al_2O_3$, $SiO_2$, GaAs, SiC, or SiGe. The substrate 10 can also have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI). The substrate 10 can also have other layers forming the substrate 10, including high-k oxides and/or nitrides. In one or more embodiments, the substrate 10 can be a silicon wafer. In an embodiment, the substrate 10 is a single crystal silicon wafer.

The shallow trench isolation (STI) regions 12 can be formed by etching a trench in doped bottom source/drain (S/D) regions (not shown) utilizing a conventional dry etching process such as reactive ion etching (RIE) or plasma etching. The trenches can optionally be lined with a conventional liner material, e.g., silicon nitride or silicon oxynitride, and then chemical vapor deposition (CVD) or another like deposition process is used to fill the trench with silicon oxide or another like STI dielectric material. The STI dielectric can optionally be densified after deposition. A conventional planarization process such as chemical-mechanical polishing (CMP) can optionally be used to provide a planar structure.

Referring to, e.g., the nanosheet stacks 20, the first semiconductor layer 22 can be the first layer in a stack of sheets of alternating materials. The nanosheet stacks 20 each include first semiconductor layers 22 and second semiconductor layers 24. Although it is specifically contemplated that the first semiconductor layers 22 can be formed from silicon germanium and that the second semiconductor layers 24 can be formed from silicon, it should be understood that any appropriate materials can be used instead, as long as the two semiconductor materials have etch selectivity with respect to one another. As used herein, the term "selective" in reference to a material removal process denotes that the rate of material removal for a first material is greater than the rate of removal for at least another material of the structure to which the material removal process is being applied. The alternating semiconductor layers 22/24 can be deposited by any appropriate mechanism. It is specifically contemplated that the semiconductor layers 22/24 can be epitaxially grown from one another, but alternate deposition processes, such as chemical vapor deposition (CVD), physical vapor deposition (PVD), atomic layer deposition (ALD), or gas cluster ion beam (GCIB) deposition, are also contemplated.

Figure 2:
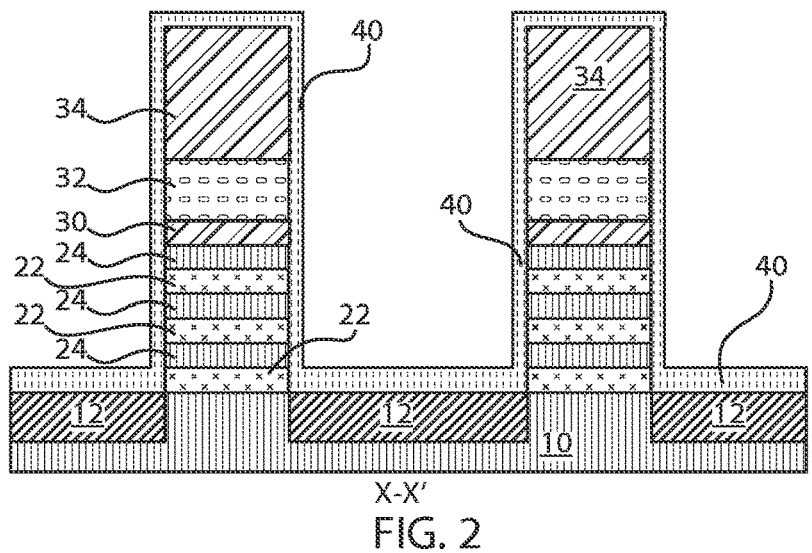
FIG. 2 is a cross-sectional view of the semiconductor structure of FIG. 1 where an oxide is deposited over the nanosheet stack, in accordance with an embodiment of the present invention.

FIG. 2 is a cross-sectional view of the semiconductor structure of FIG. 1 where an oxide is deposited over the nanosheet stack, in accordance with an embodiment of the present invention.

In various example embodiments, an oxide 40 is deposited over the nanosheet stacks 20 and encapsulates the oxide 30, the sacrificial layer 32, and the first hardmask 34.

Figure 3:
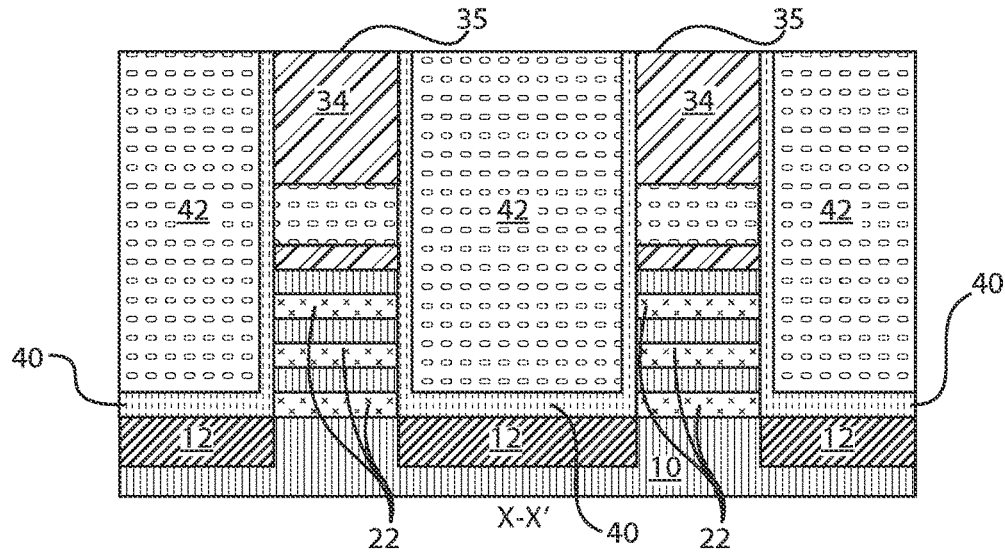
FIG. 3 is a cross-sectional view of the semiconductor structure of FIG. 2 where a dummy gate is deposited over the oxide and planarization is performed, in accordance with an embodiment of the present invention.

FIG. 3 is a cross-sectional view of the semiconductor structure of FIG. 2 where a dummy gate is deposited over the oxide and planarization is performed, in accordance with an embodiment of the present invention.

In various example embodiments, a dummy gate 42 is deposited over the oxide 40 and planarization is performed. The planarization can be, e.g., chemical-mechanical polishing (CMP). The planarization results in the exposure of top surface 35 of the first hardmask 34. The dummy gate 42 is thus formed between the nanosheet stacks 20. The dummy gate 42 can be, e.g., a-Si. The dummy gate can also be referred to as a sacrificial gate.

Figure 4:
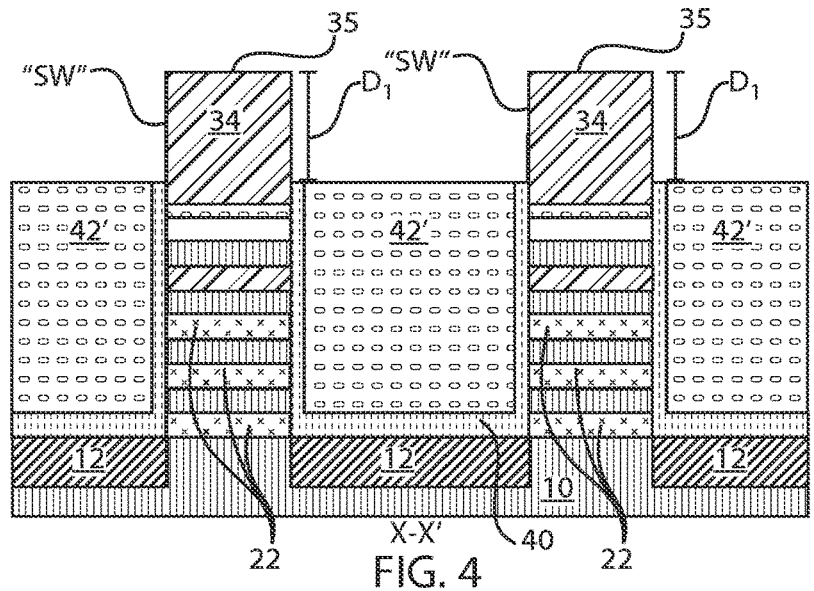
FIG. 4 is a cross-sectional view of the semiconductor structure of FIG. 3 where the dummy gate is recessed to expose a first hardmask formed over the nanosheet stack, in accordance with an embodiment of the present invention.

FIG. 4 is a cross-sectional view of the semiconductor structure of FIG. 3 where the dummy gate is recessed to expose a first hardmask formed over the nanosheet stack, in accordance with an embodiment of the present invention.

In various example embodiments, the dummy gate 42 is recessed to expose the first hardmask 34 formed over the nanosheet stacks 20. The recessing results in dummy gate regions 42' remaining between the nanosheet stacks 20. The recessing further results in sidewalls "SW" of the first hardmask 34 being exposed. The recessing can extend a distance $D_1$ from the top surface 35 of the first hardmask 34 to the top surface of the dummy gate regions 42'.

Any etching technique known in the art can be used for the recessing.

Figure 5:
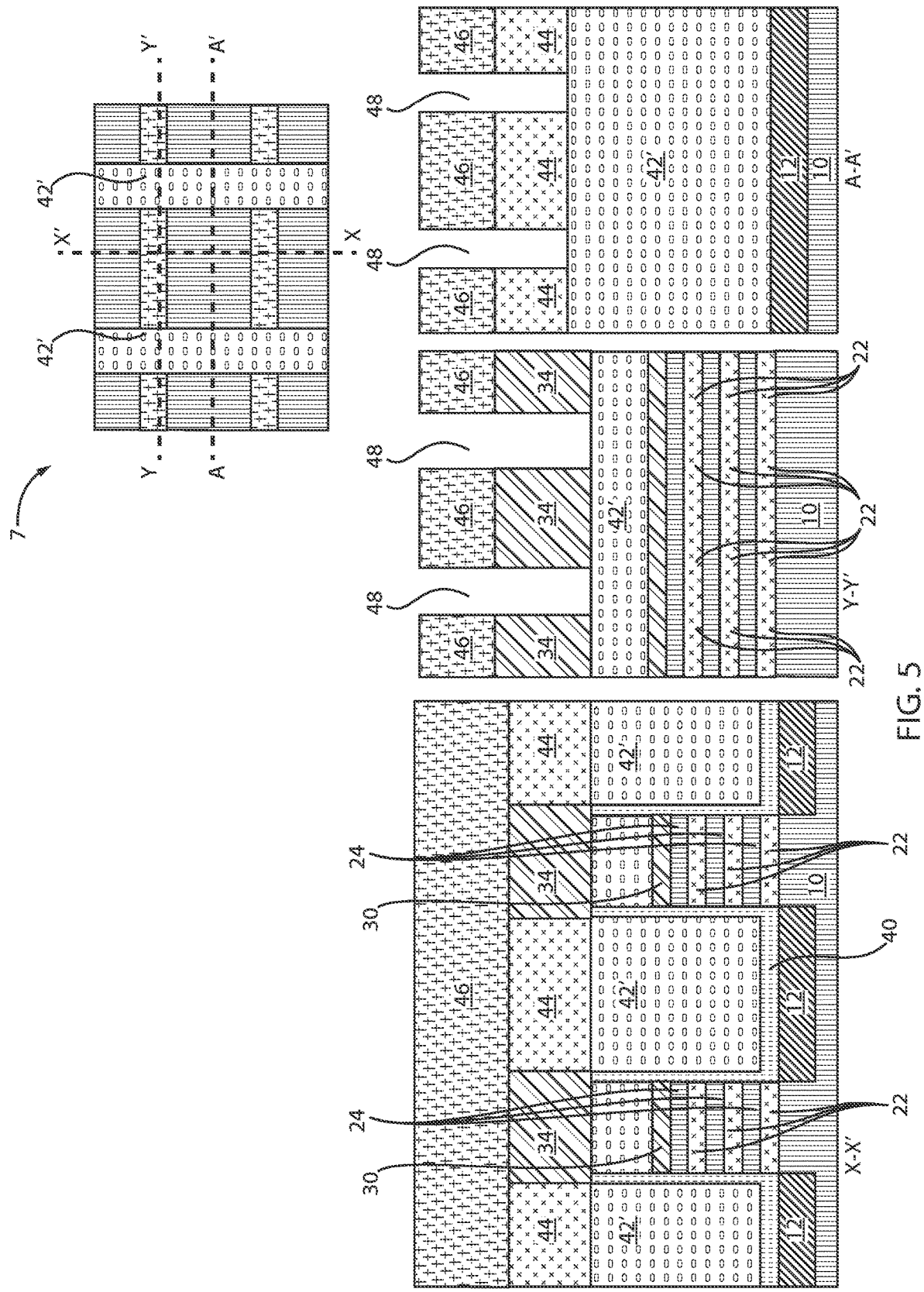
FIG. 5 is a cross-sectional view of the semiconductor structure of FIG. 4 where a second hardmask is formed adjacent the first hardmask and an organic planarization layer (OPL) is deposited over the first and second hardmasks, and where the first and second hardmasks are etched to form openings exposing an amorphous silicon (a-Si) layer formed over the nanosheet stack, in accordance with an embodiment of the present invention.

FIG. 5 is a cross-sectional view of the semiconductor structure of FIG. 4 where a second hardmask is formed adjacent the first hardmask, an organic planarization layer (OPL) is deposited over the first and second hardmasks, and where the first and second hardmasks are etched to form openings exposing an amorphous silicon (a-Si) layer formed over the nanosheet stack, in accordance with an embodiment of the present invention.

In various example embodiments, a second hardmask 44 is formed adjacent the first hardmask 34. The second hardmask 44 is planarized to be approximately level with the top surface 35 of the first hardmask 34. An OPL layer 46 is then deposited over the first and second hardmasks 34, 44. Openings 48 are then created.

The second hardmask 44 can be, e.g., a silicon monoxide (SiO) layer.

The first and second hardmasks 34, 44 are etched to form the openings 48 exposing the dummy gate regions 42' formed over the nanosheet stacks 20.

In the Y-Y' view, openings 48 extend through the OPL 46 and the first hardmask 34 to expose a top surface of the dummy gate regions 42'.

In the A-A' view, openings 48 extend through the OPL 46 and the second hardmask 44 to expose a top surface of the dummy gate regions 42'.

The top view 7 illustrates the exposure of the dummy gate regions 42'.

Figure 6:
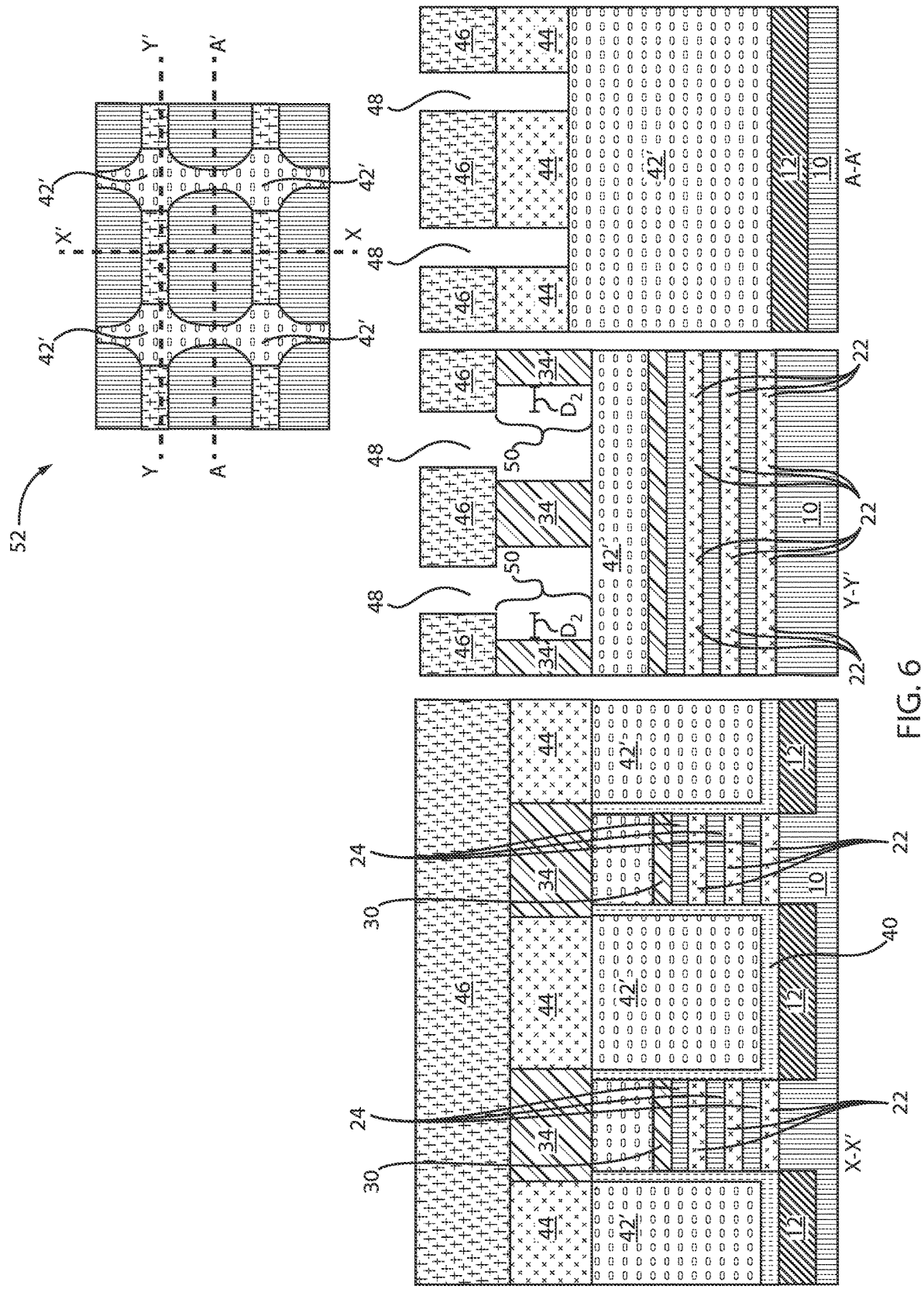
FIG. 6 is a cross-sectional view of the semiconductor structure of FIG. 5 where an isotropic etch takes place to selectively etch portions of the first hardmask to define rounded edges for the first hardmask, in accordance with an embodiment of the present invention.

FIG. 6 is a cross-sectional view of the semiconductor structure of FIG. 5 where an isotropic etch takes place to selectively etch portions of the first hardmask to define rounded edges for the first hardmask, in accordance with an embodiment of the present invention.

In various example embodiments, an isotropic etch 50 takes place to selectively etch portions of the first hardmask 34 to define rounded edges (top view 52) for the first hardmask 34. The isotropic etch 50 extends a distance $D_2$ under the OPL 46 (view Y-Y'). As noted in the top view 52, the corners of the first hardmask 34 are slightly rounded as a result of the isotropic etch 50. Any etching technique known in the art can be used.

Therefore, selectively trimming the first hardmask 34 creates a gate length over the nanosheet stacks 20 that is less than a gate length over the STI regions 12. This is further illustrated in the top view of FIG. 8 below. As a result, the selective trimming results in a non-uniform gate length, where there is shorter Lg on the active regions (nanosheet stacks 20) and a longer Lg over the STI regions 12.

Figure 7:
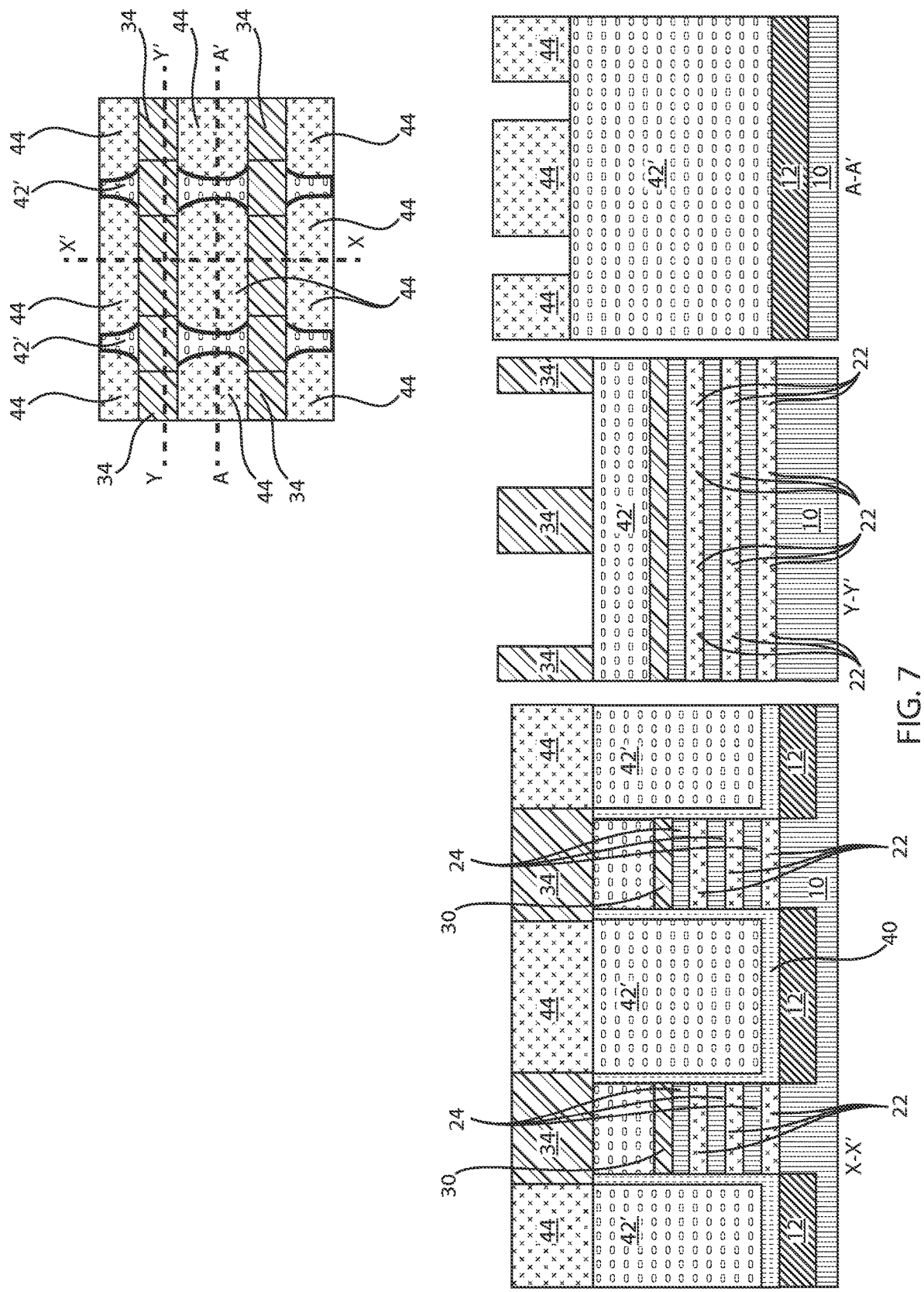
FIG. 7 is a cross-sectional view of the semiconductor structure of FIG. 6 where the OPL is removed, in accordance with an embodiment of the present invention.

FIG. 7 is a cross-sectional view of the semiconductor structure of FIG. 6 where the OPL is removed, in accordance with an embodiment of the present invention.

In various example embodiments, the OPL 46 is removed. The OPL 46 can be removed by e.g., ashing.

The removal of the OPL 46 results in the exposure of the first hardmask 34 and the second hardmask 44.

The top view illustrates the first hardmask 34, the second hardmask 44, and the dummy gate regions 42' with the rounded edges.

Figure 8:
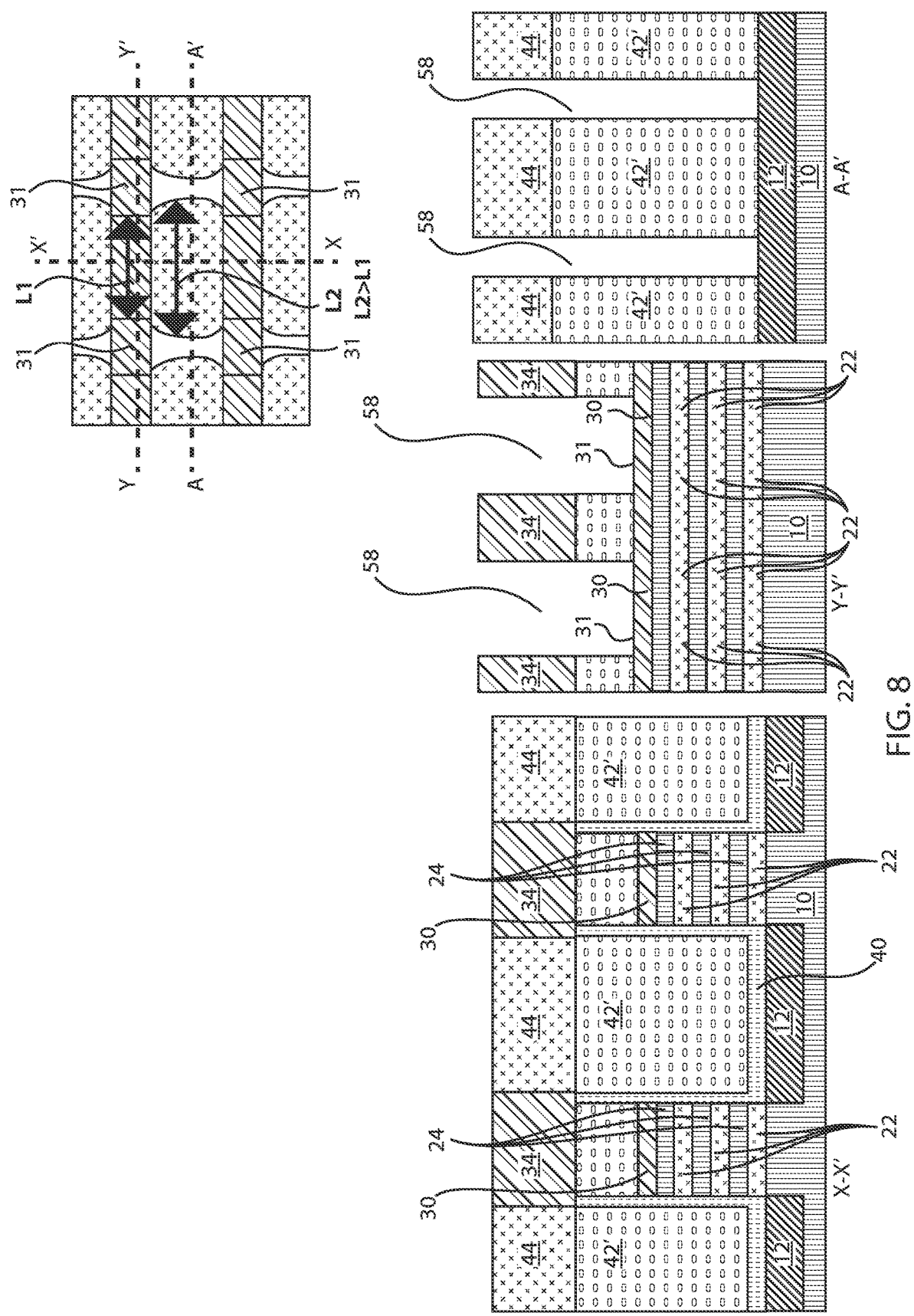
FIG. 8 is a cross-sectional view of the semiconductor structure of FIG. 7 where the first hardmask shape is transferred to the a-Si layer formed over the nanosheet stack, in accordance with an embodiment of the present invention.

FIG. 8 is a cross-sectional view of the semiconductor structure of FIG. 7 where the first hardmask shape is transferred to the a-Si layer formed over the nanosheet stack, in accordance with an embodiment of the present invention.

In various example embodiments, the first hardmask shape is transferred to the dummy gate regions 42' formed over the nanosheet stacks 20. The patterning results in openings 58.

In the Y-Y' view, a top surface 31 of the oxide 30 is exposed.

In the A-A' view, a top surface of the STI regions 12 is exposed. In the A-A' view, the openings 58 extend entirely through the dummy gate regions 42'.

In the top view, a length of the first hardmask is designated as L1 and a length of the second hardmask 44 is designated as L2. In the instant case, L2>L1. In other words, selectively trimming the first hardmask 34 creates a gate length over the nanosheet stacks 20 that is less than a gate length over the STI regions 12. As a result, the selective trimming results in a non-uniform gate length, where there is shorter Lg on the active regions (nanosheet stacks 20) and a longer Lg over the STI regions 12.

Figure 9:
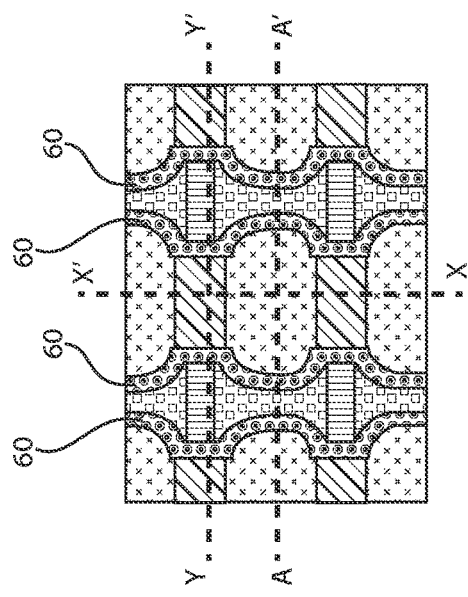
FIG. 9 is a cross-sectional view of the semiconductor structure of FIG. 8 where a gate spacer is deposited, in accordance with an embodiment of the present invention.
Figure 9:
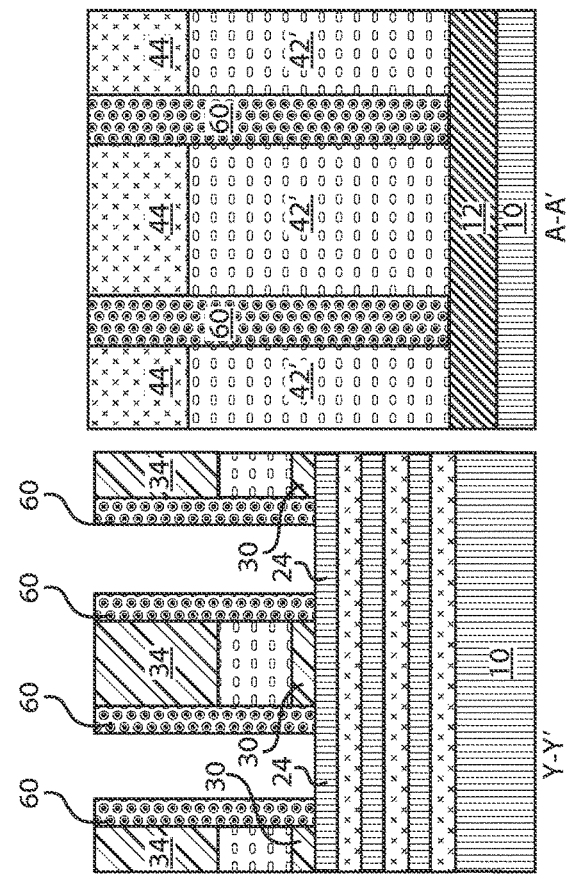
Figure 9:
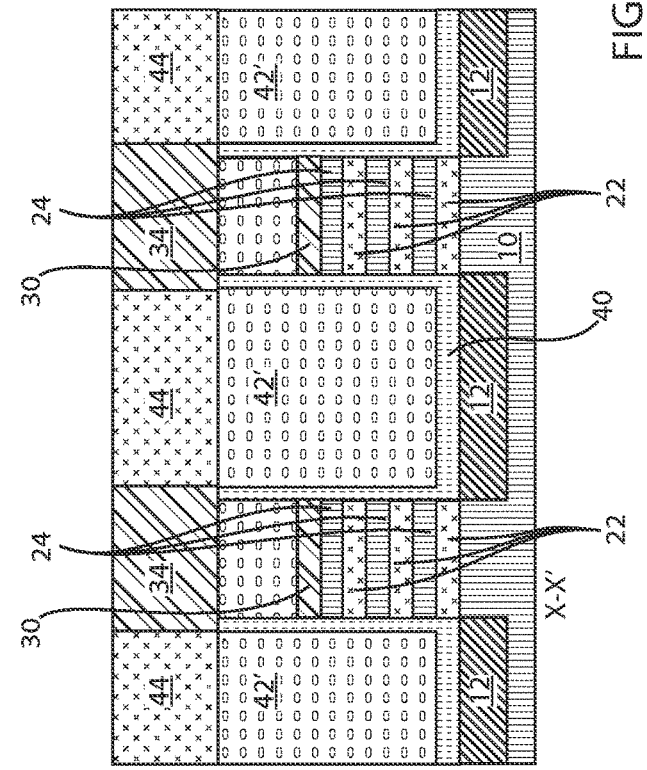

FIG. 9 is a cross-sectional view of the semiconductor structure of FIG. 8 where a gate spacer is deposited, in accordance with an embodiment of the present invention.

In various example embodiments, gate spacers 60 are formed.

In the Y-Y' view, the gate spacers 60 are formed adjacent the first hardmask 34 to a top surface of the nanosheet stacks 20.

In the A-A' view, the gate spacers 60 are formed adjacent the second hardmask 44 to a top surface of the STI regions 12. In the STI regions 12, the deposition of the gate spacers 60 can result in pinch-off between adjacent dummy gate regions 42'.

In the top view, the gate spacers 60 are shown directly contacting both the first and second hardmasks 34, 44.

Figure 10:
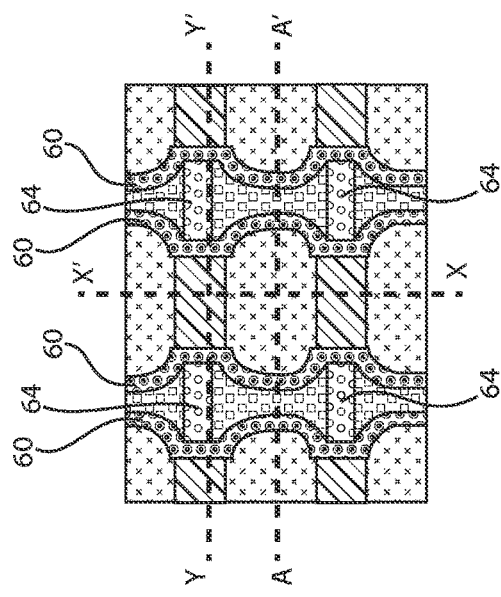
FIG. 10 is a cross-sectional view of the semiconductor structure of FIG. 9 where source/drain epitaxial regions and inner spacers are formed in the nanosheet stack, in accordance with an embodiment of the present invention.
Figure 10:
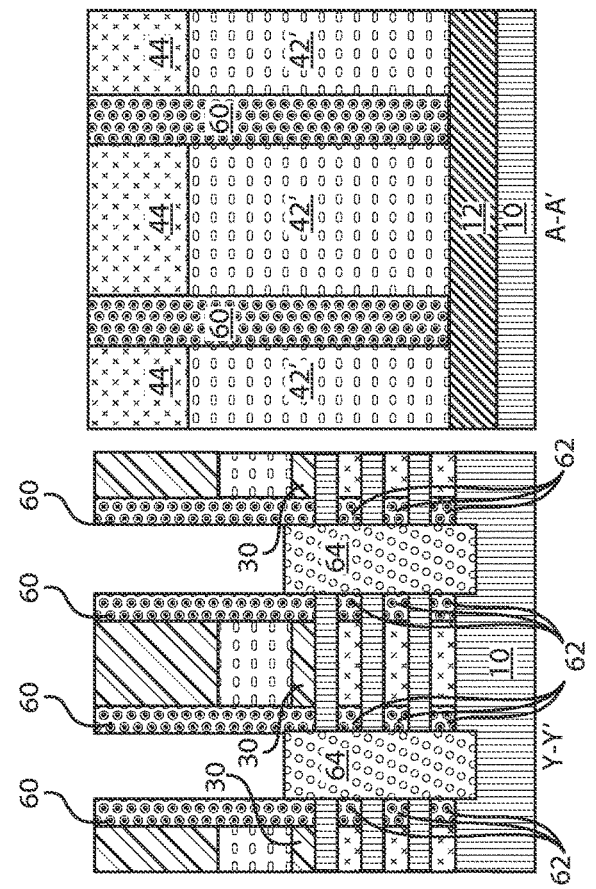
Figure 10:
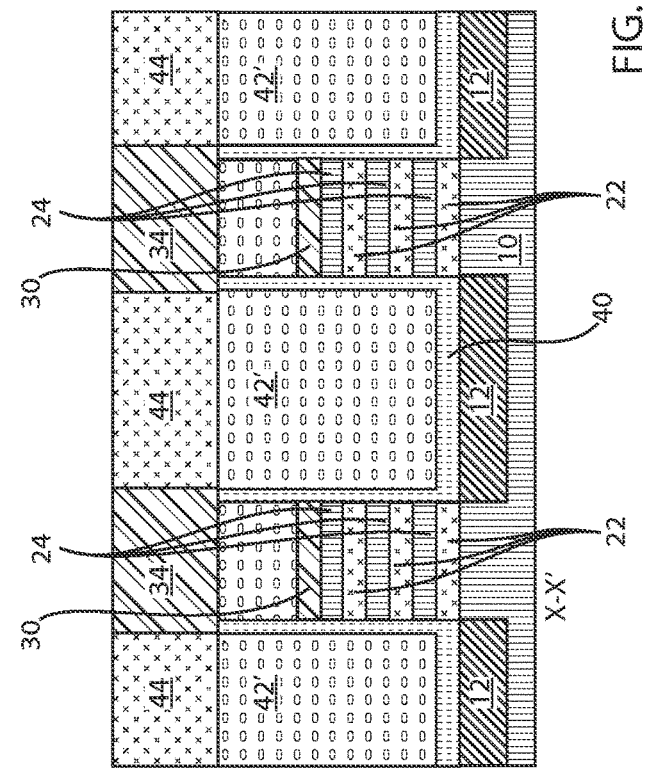

FIG. 10 is a cross-sectional view of the semiconductor structure of FIG. 9 where source/drain epitaxial regions and inner spacers are formed in the nanosheet stack, in accordance with an embodiment of the present invention.

In various example embodiments, source/drain epitaxial regions 64 and inner spacers 62 are formed in the nanosheet stacks 20. A bottom portion of the gate spacers 60 directly contact sidewalls of a top portion of the source/drain epitaxial regions 64. The source/drain epitaxial regions 64 extend above a top surface of the nanosheet stacks 20. The source/drain epitaxial regions 64 are flush with a top surface 31 of the oxide 30.

The inner spacers 62 are vertically aligned with the gate spacers 60 (Y-Y' view).

In the top view, the source/drain epitaxial regions 64 are horizontally aligned with the first hardmask 34 and the source/drain epitaxial regions 64 are horizontally misaligned or offset from the second hardmask 44. The gate spacers 60 prevent the source/drain epitaxial regions 64 from directly contacting the first and second hardmasks 34, 44.

The etching can include a dry etching process such as, for example, reactive ion etching, plasma etching, ion etching or laser ablation. The etching can further include a wet chemical etching process in which one or more chemical etchants are used to remove portions of the blanket layers that are not protected by the patterned photoresist.

In some examples, the selective wet etch or the selective dry etch can selectively remove the portions of first semiconductor layer 22 (e.g., the SiGe layer) and leave the entirety or portions of the second semiconductor layer 24. The removal creates gaps or openings or indentations between the second semiconductor layers 24 of the FET devices.

The dry and wet etching processes can have etching parameters that can be tuned, such as etchants used, etching temperature, etching solution concentration, etching pressure, source power, RF bias voltage, RF bias power, etchant flow rate, and other suitable parameters. Dry etching processes can include a biased plasma etching process that uses a chlorine-based chemistry. Other dry etchant gasses can include Tetrafluoromethane ($CF_4$), nitrogen trifluoride ($NF_3$), sulfur hexafluoride ($SF_6$), and helium (He), and Chlorine trifluoride ($ClF_3$). Dry etching can also be performed anisotropically using such mechanisms as DRIE (deep reactive-ion etching). Chemical vapor etching can be used as a selective etching method, and the etching gas can include hydrogen chloride (HCl), Tetrafluoromethane ($CF_4$), and gas mixture with hydrogen ($H_2$). Chemical vapor etching can be performed by CVD with suitable pressure and temperature.

Figure 11:
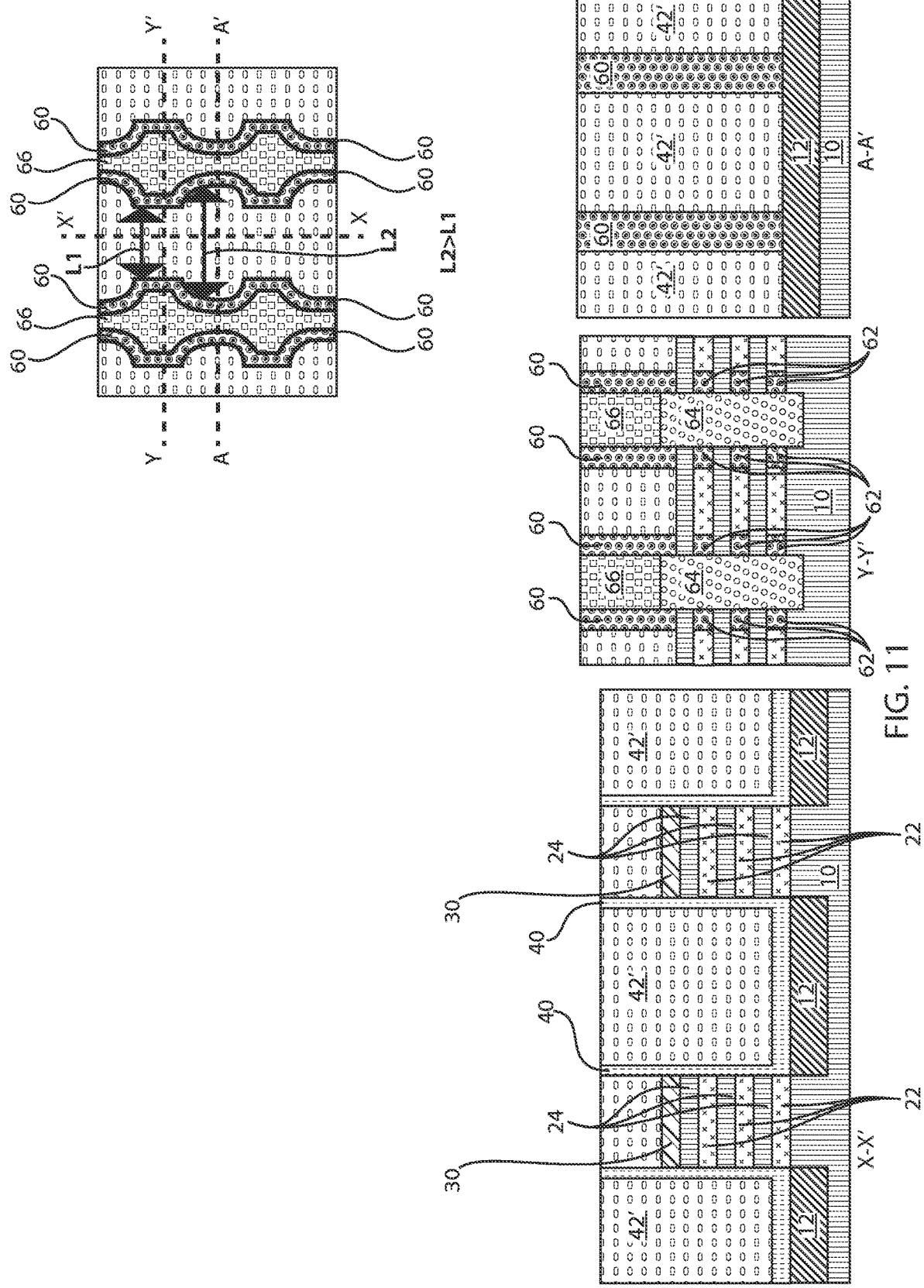
FIG. 11 is a cross-sectional view of the semiconductor structure of FIG. 10 where the first and second hardmasks are removed and an interlayer dielectric (ILD) is formed over the source/drain epitaxial regions, in accordance with an embodiment of the present invention.

FIG. 11 is a cross-sectional view of the semiconductor structure of FIG. 10 where the first and second hardmasks are removed and an interlayer dielectric (ILD) is formed over the source/drain epitaxial regions, in accordance with an embodiment of the present invention.

In various example embodiments, the first and second hardmasks 34, 44 are removed and an interlayer dielectric (ILD) 66 is formed over and in direct contact with the source/drain epitaxial regions 64.

In the top view, a distance L1 is shown between active regions and a distance L2 is shown between the STI regions, where L2>L1, meaning that the gate length is longer on the STI regions and the gate length is shorter on the active regions (nanosheet stacks 20). Therefore, the gate length is not uniform throughout. Instead, the gate length varies across the length of the nanosheet transistor. For example, at view A-A', the length is greater or longer between adjacent gate spacers 60, whereas at view Y-Y', the length is shorter or lesser between adjacent gate spacers 60.

The ILD 66 can be any suitable material, such as, for example, porous silicates, carbon doped oxides, silicon dioxides, silicon nitrides, silicon oxynitrides, or other dielectric materials. Any known manner of forming the ILD 66 can be utilized. The ILD 66 can be formed using, for example, CVD, PECVD, ALD, flowable CVD, spin-on dielectrics, or PVD.

Figure 12:
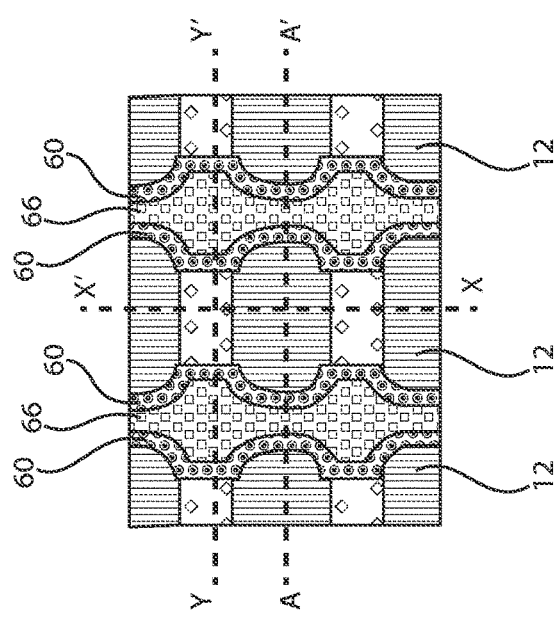
FIG. 12 is a cross-sectional view of the semiconductor structure of FIG. 11 where the dummy gate regions and the alternating sacrificial layers of the nanosheet stack are removed, in accordance with an embodiment of the present invention.
Figure 12:
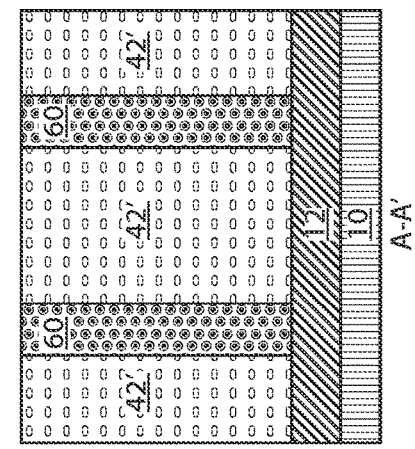
Figure 12:
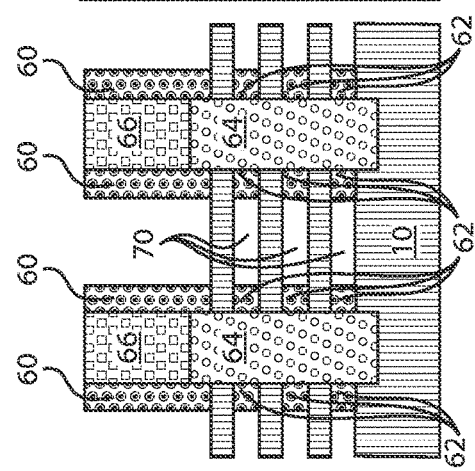
Figure 12:
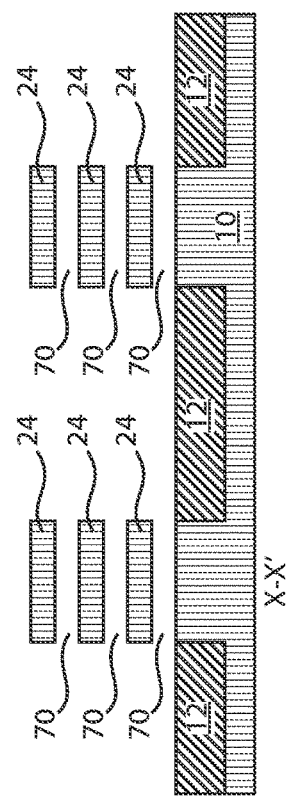

FIG. 12 is a cross-sectional view of the semiconductor structure of FIG. 11 where the dummy gate regions and the alternating sacrificial layers of the nanosheet stack are removed, in accordance with an embodiment of the present invention.

In various example embodiments, the dummy gate regions 42' and the alternating sacrificial layers 22 of the nanosheet stacks 20 are removed. This results in gaps or voids 70 formed between the alternating semiconductor layers 24 (e.g., Si layers).

Figure 13:
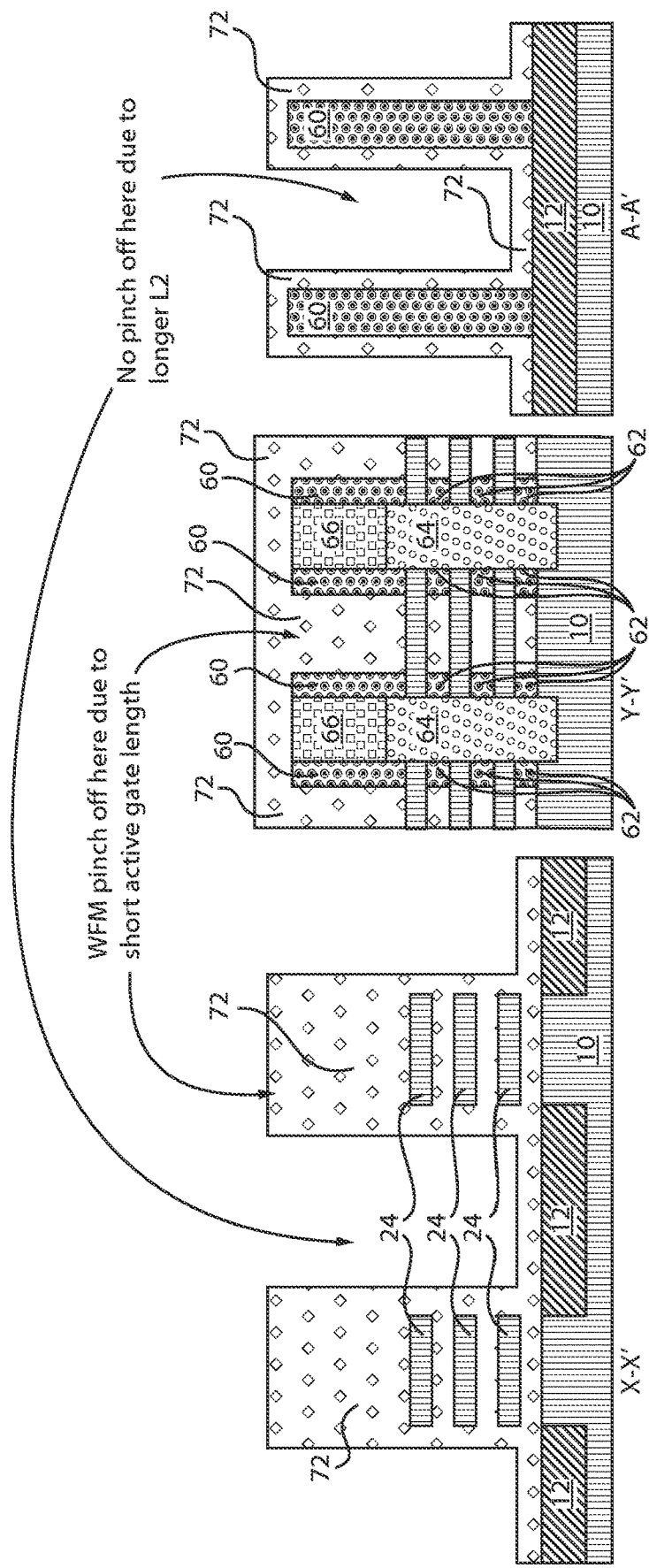
FIG. 13 is a cross-sectional view of the semiconductor structure of FIG. 12 where work-function metal (WFM) deposition takes place, in accordance with an embodiment of the present invention.

FIG. 13 is a cross-sectional view of the semiconductor structure of FIG. 12 where work-function metal (WFM) deposition takes place, in accordance with an embodiment of the present invention.

In various example embodiments, work-function metal (WFM) deposition takes place. The WFM 72 fills the gaps or voids 70. The WFM 72 directly contacts the gate spacers 60 such that WFM 72 encapsulates the gate spacers 60. The WFM 72 directly contacts the inner spacers 62.

In the Y-Y' view, the WFM 72 pinches off due to the short active gate length.

In the A-A' view, the WFM 72 does not cause any pinch off due to the longer gate length over the STI regions 12.

In various embodiments, the WFM 72 can include but is not limited to work function metals such as titanium nitride, titanium carbide, titanium aluminum carbide, tantalum nitride and tantalum carbide; conducting metals such as tungsten, aluminum and copper; and oxides such as silicon dioxide ($SiO_2$), hafnium oxide (e.g., $HfO_2$), hafnium silicon oxide (e.g., $HfSiO_4$), hafnium silicon oxynitride ($Hf_wSi_xO_yN_z$), lanthanum oxide (e.g., $La_2O_3$), lanthanum aluminum oxide (e.g., $LaAlO_3$), zirconium oxide (e.g., $ZrO_2$), zirconium silicon oxide (e.g., $ZrSiO_4$), zirconium silicon oxynitride ($Zr_wSi_xO_yN_z$), tantalum oxide (e.g., $TaO_2$, $Ta_2O_5$), titanium oxide (e.g., $TiO_2$), barium strontium titanium oxide (e.g., $BaTiO_3$—$SrTiO_3$), barium titanium oxide (e.g., $BaTiO_3$), strontium titanium oxide (e.g., $SrTiO_3$), yttrium oxide (e.g., $Y_2O_3$), aluminum oxide (e.g., $Al_2O_3$), lead scandium tantalum oxide ($Pb(Sc_xTa_{1-x})O_3$), and lead zinc niobate (e.g., $PbZn_{1/3}Nb_{2/3}O_3$).

Figure 14:
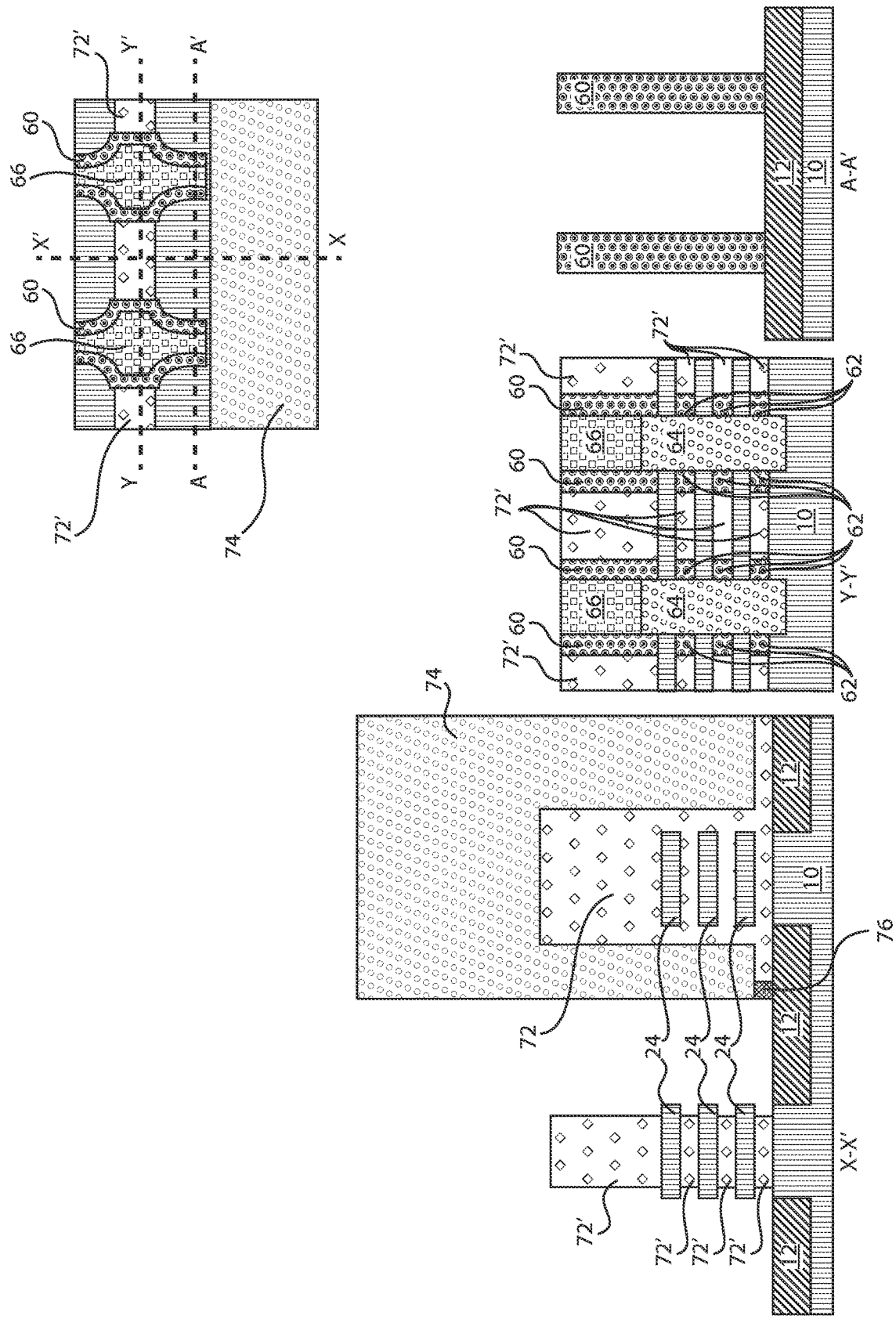
FIG. 14 is a cross-sectional view of the semiconductor structure of FIG. 13 where a mask is deposited to pattern the WFM, the WFM is exposed to an isotropic etch, and a WFM seal is formed under the mask, in accordance with an embodiment of the present invention.

FIG. 14 is a cross-sectional view of the semiconductor structure of FIG. 13 where a mask is deposited to pattern the WFM, the WFM is exposed to an isotropic etch, and a WFM seal is formed under the mask, in accordance with an embodiment of the present invention.

In various example embodiments, a mask 74 is deposited to pattern the WFM 72. As shown, for illustrative purposes, one of the nanosheet stacks (right-hand side) is covered by the mask 74. The WFM 72 is then exposed to an isotropic etch where portions of the WFM 72 are removed. As a result, remaining WFM regions 72' are illustrated.

In the X-X' view, distal and proximal ends of the alternating semiconductor layers 24 are exposed.

In the Y-Y' view, top surfaces of the gate spacers 60 are exposed and top surfaces of the ILD 66 are exposed.

In the A-A' view, the gate spacers 60 are shown to be completely exposed.

The top view illustrates how the mask 74 masks the right-hand nanosheet stack.

Finally, a WFM seal 76 is formed under the mask 74 and adjacent to a WFM region 72'.

The WFM seal 76 can be formed by a divot fill method. The WFM seal 76 can be formed because the WFM is not pinched off in the L2 region.

Figure 15:
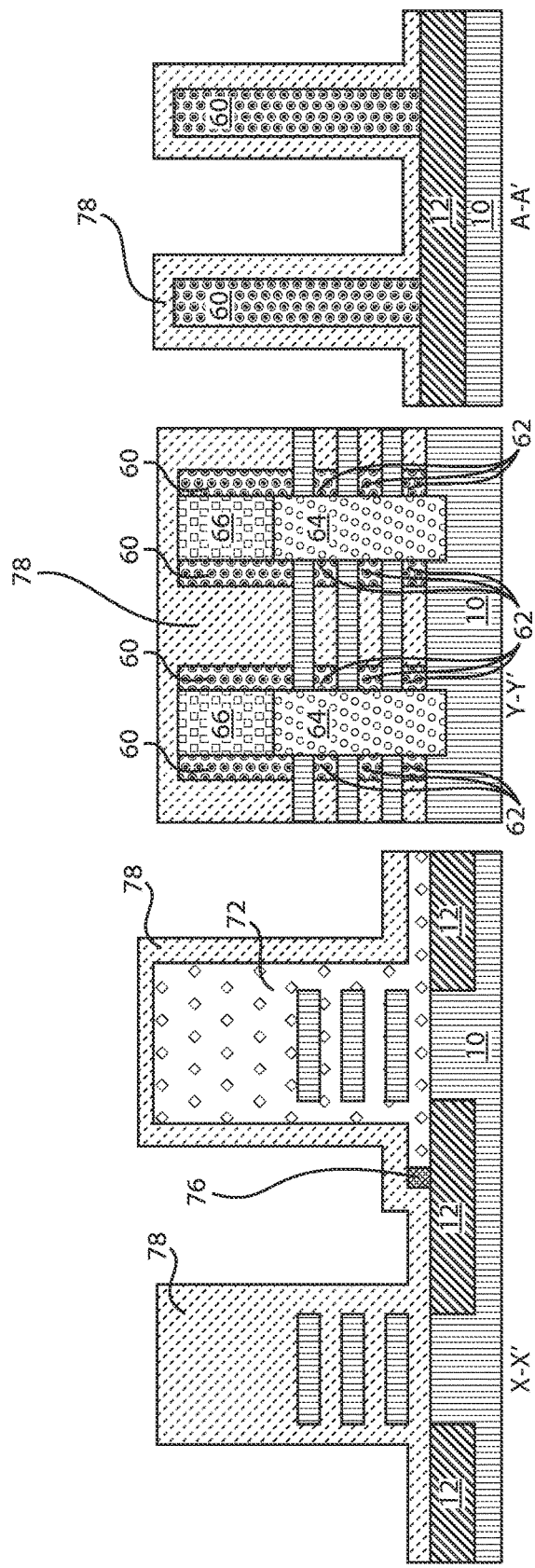
FIG. 15 is a cross-sectional view of the semiconductor structure of FIG. 14 where the remaining WFM is etched away, the mask is removed, and then another WFM is deposited, in accordance with an embodiment of the present invention.

FIG. 15 is a cross-sectional view of the semiconductor structure of FIG. 14 where the remaining WFM is etched away, the mask is removed, and then another WFM is deposited, in accordance with an embodiment of the present invention.

In various example embodiments, the remaining WFM 72' is etched away, the mask 74 is then removed, and then another WFM 78 is deposited.

In the X-X' view, the WFM 78 fills the gaps or voids 70 and surrounds the alternating semiconductor layers 24 (left-hand side nanosheet stack). In the X-X' view, the WFM 78 directly contacts the WFM 72 and directly contacts the WFM seal 76 (right-hand side nanosheet stack).

In the Y-Y' view, the WFM 78 directly contacts the gate spacers 60 and directly contacts the inner spacers 62. The WFM 78 also directly contacts the top surface of the ILD 66.

In the A-A' view, the WFM 78 directly contacts and surrounds or covers the gate spacers 60.

Figure 16:
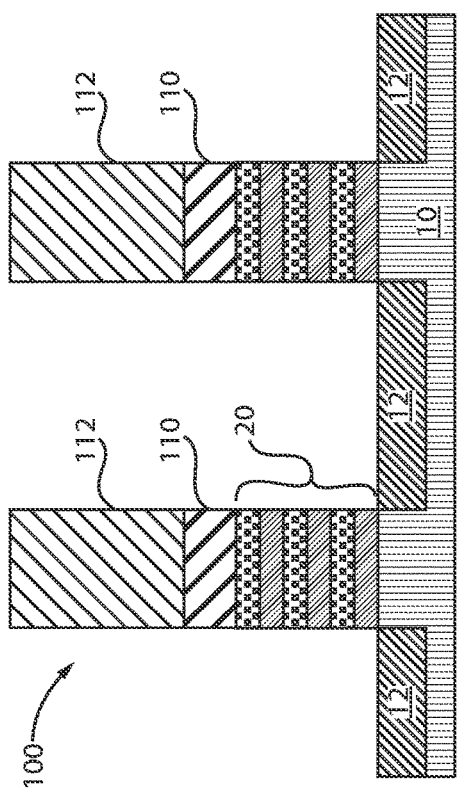
FIG. 16 is a cross-sectional view of a semiconductor structure including a nanosheet stack formed over a substrate, where no a-Si is formed over the nanosheet stack in contract to FIG. 1, in accordance with another embodiment of the present invention.

FIG. 16 is a cross-sectional view of a semiconductor structure including a nanosheet stack formed over a substrate, where no a-Si is formed over the nanosheet stack in contract to FIG. 1, in accordance with another embodiment of the present invention.

In another example embodiment, in structure 100, a nanosheet stack 20 is formed, where the sacrificial layer 32 of FIG. 1 is omitted. As such, an oxide 110 is formed over and in direct contact with the nanosheet stack 20. A hardmask 112 is then formed over the oxide 110.

Figure 17:
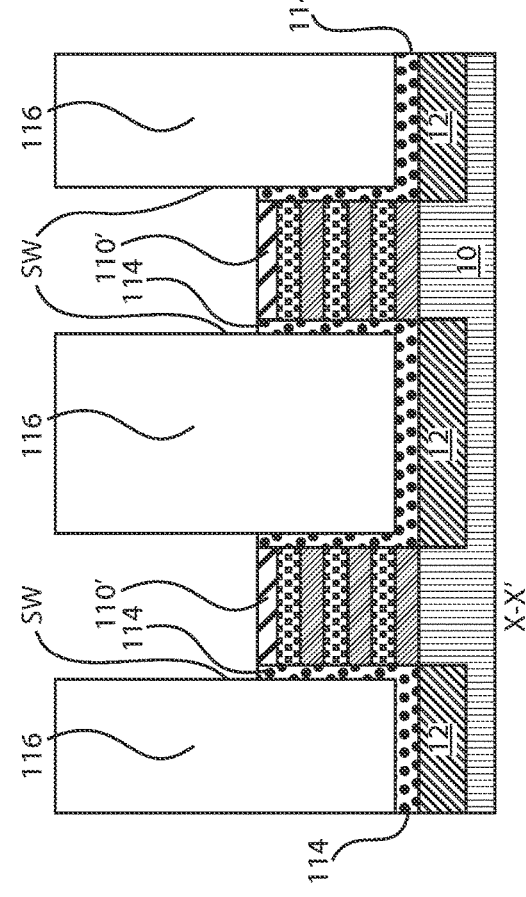
FIG. 17 is a cross-sectional view of the semiconductor structure of FIG. 16 where an oxide is deposited, a dummy material is deposited over the oxide, planarization is performed, the hardmask of the nanosheet stack is recessed, and exposed oxide sections are removed, in accordance with an embodiment of the present invention.

FIG. 17 is a cross-sectional view of the semiconductor structure of FIG. 16 where an oxide is deposited, a dummy material is deposited over the oxide, planarization is performed, the hardmask of the nanosheet stack is recessed, and exposed oxide sections are removed, in accordance with an embodiment of the present invention.

In various example embodiments, an oxide 114 is deposited, a dummy material 116 is deposited over the oxide 114, planarization is performed, the hardmask 112 of the nanosheet stack 20 is recessed, and exposed oxide sections adjacent the hardmask 112 are removed. As a result, the sidewalls "SW" of the dummy material 116 are exposed and the oxide 110 is recessed to oxide portion 110'.

Figure 18:
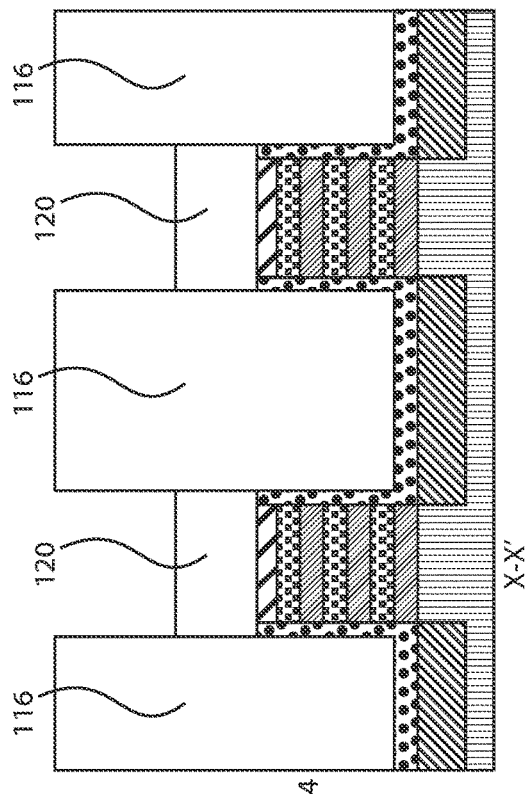
FIG. 18 is a cross-sectional view of the semiconductor structure of FIG. 17 where a directional fill takes place to deposit a-Si portions over the nanosheet stack, in accordance with an embodiment of the present invention.

FIG. 18 is a cross-sectional view of the semiconductor structure of FIG. 17 where a directional fill takes place to deposit a-Si portions over the nanosheet stack, in accordance with an embodiment of the present invention.

In various example embodiments, a directional fill takes place to deposit a-Si portions 120 over the nanosheet stack 20. The a-Si portions 120 directly contact the oxide portions 110'. This is in contrast to the configuration described above with respect to FIGS. 1-5.

Figure 19:
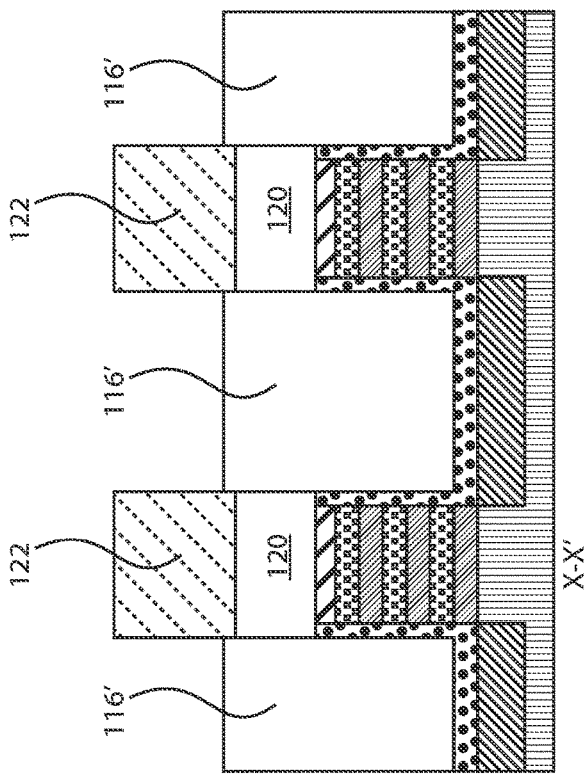
FIG. 19 is a cross-sectional view of the semiconductor structure of FIG. 18 where a first hardmask is deposited over the a-Si portions and the exposed a-Si dummy material is recessed to expose the sidewalls of the first hardmask, in accordance with an embodiment of the present invention.

FIG. 19 is a cross-sectional view of the semiconductor structure of FIG. 18 where a first hardmask is deposited over the a-Si portions and the exposed a-Si dummy material is recessed to expose the sidewalls of the first hardmask, in accordance with an embodiment of the present invention.

In various example embodiments, a first hardmask 122 is deposited over and in direct contact with the a-Si portions 120 and the exposed a-Si dummy material is recessed to expose the sidewalls of the first hardmask 122. The remaining dummy material portions are designated as 116'.

Figure 20:
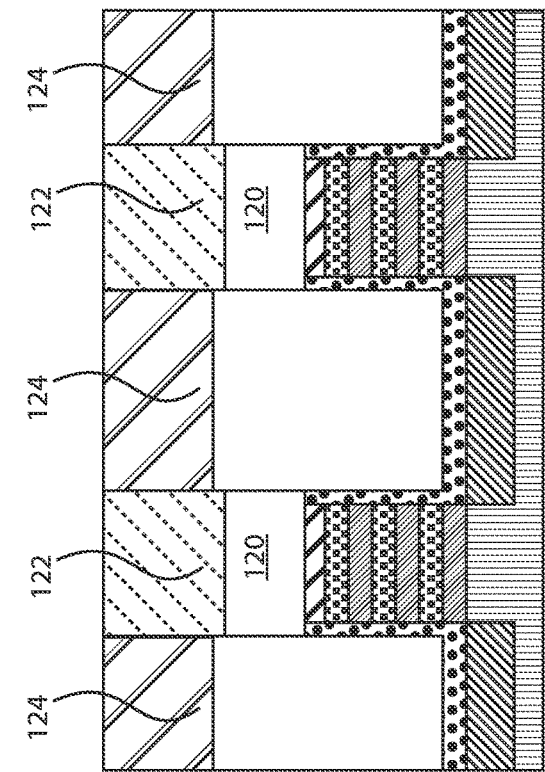
FIG. 20 is a cross-sectional view of the semiconductor structure of FIG. 19 where a second hardmask is deposited adjacent the first hardmask, in accordance with an embodiment of the present invention.

FIG. 20 is a cross-sectional view of the semiconductor structure of FIG. 19 where a second hardmask is deposited adjacent the first hardmask, in accordance with an embodiment of the present invention.

In various example embodiments, a second hardmask 124 is deposited adjacent the first hardmask 122. The rest of the processing is similar to the processing of FIGS. 6-15.

In conclusion, the exemplary embodiments of the present invention present a method and structure of forming non-uniform gate length (Lg), where shorter Lg is on the active region but longer on the STI region, and the work function can pinch-off over the gate in the active region with smaller Lg but not pinch-off in the gate with the larger Lg over the STI region. Therefore, the exemplary embodiments of the present invention pertain to non-uniform gate length for a single horizontal transistor. As a result, the exemplary embodiments of the present invention present a method and structure of forming non-uniform gate length in which Lg variation is self-aligned to the active region, which provides wider room in the gate-over-STI region for WFM patterning.

In one example embodiment, the nanosheet device includes non-uniform gate length, that is, shorter Lg on the active region but longer Lg on STI region, where the Lg variation is substantially aligned to the active region and the work function can pinch-off over the gate in the active region with smaller Lg but not pinch-off in the gate with the larger Lg over the STI region. The method of forming the nanosheet device includes forming at least a first hardmask material over the nanosheets, forming a first dummy gate, recessing the first dummy gate such that the top surface of the first dummy gate is below the top surface of the first hardmask material, forming a second hardmask material in the recess, defining a uniform Lg in both the first and second hardmasks, and selectively trimming the first hardmask such that the Lg over the nanosheets become smaller.

Regarding FIGS. 1-20, deposition is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others. As used herein, "depositing" can include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

The term "processing" as used herein includes deposition of material or photoresist, patterning, exposure, development, etching, cleaning, stripping, implanting, doping, stressing, layering, and/or removal of the material or photoresist as needed in forming a described structure.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which usually include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIG. 1t will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method for forming a short gate on the active region and a longer gate on shallow trench isolation (STI) region for nanosheet (NS) multi-threshold integration (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for forming a nanosheet device, the method comprising:
    forming nanosheets stacks over a substrate, the nanosheet stacks separated by shallow trench isolation (STI) regions;
    forming a first hardmask material over the nanosheet stacks;
    depositing a sacrificial gate;
    recessing the sacrificial gate such that recesses are defined adjacent the first hardmask material, wherein a top surface of the sacrificial gate is below a top surface of the first hardmask material;
    forming a second hardmask material in the recesses;
    defining a uniform gate length in both the first and second hardmask materials; and
    selectively trimming the first hardmask material such that a gate length over the nanosheet stacks is less than a gate length over the STI regions.

2. The method of claim 1, further comprising etching the sacrificial gate to define openings exposing a top surface of the STI regions.

3. The method of claim 2, further comprising forming gate spacers over the nanosheet stacks and within the openings defined over the STI regions.

4. The method of claim 3, further comprising forming source/drain epitaxial regions and inner spacers in the nanosheet stacks.

5. The method of claim 4, wherein the inner spacers are vertically aligned with the gate spacers.

6. The method of claim 4, wherein the source/drain epitaxial regions directly contact lower inner sidewalls of the gate spacers.

7. The method of claim 4, further comprising depositing an interlayer dielectric (ILD) over and in direct contact with the source/drain epitaxial regions.

8. The method of claim 7, further comprising removing the sacrificial gate and alternate semiconductor layers of the nanosheet stacks.

9. The method of claim 8, further comprising depositing a first work function metal (WFM) in direct contact with the STI regions and in direct contact with the gate spacers.

10. The method of claim 9, wherein the first WFM pinches off in a region defined by the gate length over the nanosheet stacks and the first WFM is prevented from pinching off in a region defined by the gate length over the STI regions.

11. The method of claim 10, further comprising forming a mask over a nanosheet stack of the nanosheet stacks to etch the first WFM.

12. The method of claim 11, further comprising forming a WFM seal under the mask.

13. The method of claim 12, further comprising removing remaining first WFM and removing the mask to deposit a second WFM.

14. A method for forming a nanosheet device, the method comprising:
    forming nanosheets stacks over a substrate, the nanosheet stacks separated by shallow trench isolation (STI) regions;
    forming a first hardmask material over the nanosheet stacks;
    depositing a first sacrificial material;
    removing the first hardmask material such that first recesses are defined over the nanosheet stacks;
    depositing a second sacrificial material in the first recesses defined over the nanosheet stacks;
    forming a second hardmask material over the second sacrificial material;
    recessing the first sacrificial material such that second recesses are defined adjacent the second hardmask material;
    forming a third hardmask material within the second recesses;
    defining a uniform gate length in both the second and third hardmask materials; and
    selectively trimming the second hardmask material such that a gate length over the nanosheet stacks is less than a gate length over the STI regions.

15. The method of claim 14, further comprising forming gate spacers over the nanosheet stacks.

16. The method of claim 15, further comprising forming source/drain epitaxial regions and inner spacers in the nanosheet stacks.

17. The method of claim 16, wherein the inner spacers are vertically aligned with the gate spacers.

18. The method of claim 16, wherein the source/drain epitaxial regions directly contact lower inner sidewalls of the gate spacers.

19. A nanosheet transistor comprising:
    nanosheets stacks disposed over a substrate, the nanosheet stacks separated by shallow trench isolation (STI) regions to define a non-uniform gate length across the nanosheet transistor such that a gate length over the nanosheet stacks is less than a gate length over the STI regions; and
    a work function metal (WFM) disposed over the nanosheet stacks and the STI regions, wherein the WFM pinches off in a region defined by the gate length over the nanosheet stacks and the WFM is prevented from pinching off in a region defined by the gate length over the STI regions.

20. The nanosheet transistor of claim 19, wherein gate spacers are disposed over the nanosheet stacks.

\* \* \* \* \*